United States Patent
Fang et al.

(10) Patent No.: US 7,112,123 B2
(45) Date of Patent: Sep. 26, 2006

(54) CHEMICAL-MECHANICAL POLISHING (CMP) SLURRY CONTAINING CLAY AND $CeO_2$ ABRASIVE PARTICLES AND METHOD OF PLANARIZING SURFACES

(75) Inventors: Mingming Fang, Naperville, IL (US); Michael R. Ianiro, Macon, GA (US); Don Eisenhour, Grayslake, IL (US)

(73) Assignee: Amcol International Corporation, Arlington Heights, IL (US)

( * ) Notice: Subject to any disclaimer, the term of this patent is extended or adjusted under 35 U.S.C. 154(b) by 200 days.

(21) Appl. No.: 10/867,337

(22) Filed: Jun. 14, 2004

(65) Prior Publication Data

US 2005/0277367 A1    Dec. 15, 2005

(51) Int. Cl.
*B24B 1/00* (2006.01)
(52) U.S. Cl. .................... 451/41; 451/28; 451/285
(58) Field of Classification Search ........... 451/41, 451/28, 285–288, 56, 268, 269; 51/295, 51/306, 297; 438/691–693
See application file for complete search history.

(56) References Cited

U.S. PATENT DOCUMENTS

| | | | |
|---|---|---|---|
| 5,958,794 A | 9/1999 | Bruxvoort et al. | |
| 6,183,346 B1* | 2/2001 | Gagliardi | 451/28 |
| 6,602,439 B1* | 8/2003 | Hampden-Smith et al. | 252/79.1 |
| 6,841,480 B1* | 1/2005 | Simpson et al. | 438/691 |
| 6,976,905 B1* | 12/2005 | Fang et al. | 451/41 |
| 2004/0224622 A1* | 11/2004 | Sakurai et al. | 451/526 |
| 2005/0277367 A1* | 12/2005 | Fang et al. | 451/41 |

FOREIGN PATENT DOCUMENTS

WO    WO-2004/063301 A1    7/2004

OTHER PUBLICATIONS

PCT International Search Report from the European Patent Office for International Patent Application No. PCT/US2005/02716 dated Sep. 23, 2005 (2 pages).

* cited by examiner

*Primary Examiner*—Lee D. Wilson
(74) *Attorney, Agent, or Firm*—Marshall, Gerstein & Borun LLP

(57) ABSTRACT

A composition for planarizing or polishing a surface comprising (a) a liquid carrier, and (b) solids comprising about 0.1 to about 10% by weight clay abrasive particles, and about 0.1% to about 50% by weight $CeO_2$ particles, based on the total weight of solids in the composition, said clay and $CeO_2$ abrasive particles having a particle size such that at least 90% of the particles (by number), when slurried in water, have a particle size in the range of about 10 nm to about 10 μm.

14 Claims, 3 Drawing Sheets

CHEMICAL-MECHANICAL POLISHING (CMP) SLURRY CONTAINING CLAY AND $CeO_2$ ABRASIVE PARTICLES AND METHOD OF PLANARIZING SURFACES

TECHNICAL FIELD

The present invention is directed to abrasive compositions containing clay and $CeO_2$ abrasive particles and methods of planarizing or polishing surfaces, particularly glass surfaces. The composition is used as an aqueous slurry, and also is useful as a planarization composition in the manufacture of microelectronic devices, e.g., integrated circuits, wafers, memory disks and rigid disks.

BACKGROUND

Compositions for planarizing or polishing the surface of a substrate are well known in the art. Polishing slurries typically contain an abrasive material in an aqueous solution and are applied to a surface by contacting the surface with a polishing pad saturated with the slurry composition. Typical abrasive materials include silicon dioxide, cerium oxide, aluminum oxide, zirconium oxide, and tin oxide. U.S. Pat. No. 5,527,423, for example, describes a method for chemically-mechanically polishing a metal layer by contacting the surface with a polishing slurry comprising high purity fine metal oxide particles in an aqueous medium.

Glass magnetic-memory disks have been used as computer hard drives for storing data in lap-top and desk-top PCs for many years. In order to increase the storing capability of hard drives, these glass substrates must be planarized before the magnetic layers are deposited on their surfaces. Chemical Mechanical Planarization (CMP) is used to accomplish this task. The glass disks are polished under pressure against the polishing pad with a polishing slurry continuously supplied on the polishing surfaces.

Glass disks used in laptop hard drives are usually polished (CMP) in two steps: first-step polishing and second-step polishing (or fine polishing). The first-step polishing removes bulk substrate materials from the original substrate. A number of scratches and other defects remain on the surface after the first polishing step. The purpose of the second step polishing is to eliminate all surface defects and generate a very smooth surface. The clay and $CeO_2$ abrasive particles contained in the compositions described herein can be used in both polishing steps.

The term "glass" refers to either silicate ($SiO_2$ -based) or borate ($B_2O_3$ -based) glasses which differs in the concentration of modifier ions (such as $Pb^{2+}$, $La^{3+}$, and the like). Non-limiting examples of "glass" include: glass disks used in laptop computer hard drives, and different silicon oxides used in ILD (interlevel dielectrics) in IC manufacturing.

Conventional polishing compositions typically are not entirely satisfactory at planarizing semiconductor wafers or integrated circuits having alternating layers of conductive metal and insulating material, e.g., silicon dioxide, that require planar surfaces. In particular, polishing slurries can have less than desirable polishing rates, and their use in chemically-mechanically polishing semiconductor surfaces can result in poor surface quality. Because the performance of a semiconductor wafer is directly associated with the planarity of its surface, it is crucial to use a polishing composition that has a high polishing efficiency, uniformity, and removal rate and leaves a high quality polish with minimal surface defects.

Ceria ($CeO_2$) particles are the most commonly used abrasive material in glass CMP slurry formulations due to their unique chemical properties under basic conditions. Different sizes and distributions of $CeO_2$ are selected for different glass CMP slurries in order to meet the requirements of polishing rate and surface roughness. Many glass disk suppliers develop their own ceria-based CMP slurries. Most of these companies are Japanese, such as Hoya, Toyo Kohan, and Fujimi.

Since the trend is always to minimize the size of electronic units and maximize the speed and capability of the storing devices, disk manufacturing companies are continuously looking for ways to improve their polishing rate while decreasing surface roughness. From a slurry composition point of view, one way to accomplish this is to use smaller $CeO_2$ particles to decrease the surface roughness and add chemical additives to enhance the rate; another way is to find novel abrasives.

There have been many attempts to improve the polishing efficiency and uniformity of conventional polishing agents, while minimizing defects in the polished surface and damage to underlying structures or topography. For example, U.S. Pat. No. 5,340,370 describes a polishing composition comprising an abrasive, an oxidizing agent, and water, which purportedly yields an improved removal rate and polishing efficiency. Similarly, U.S. Pat. No. 5,622,525 describes a polishing composition comprising colloidal silica having an average particle size of 20–50 nm, a chemical activator, and demineralized water.

U.S. Pat. No. 5,958,794 ('794) discloses fixed abrasive polishing pads that can perform the CMP function without an abrasive slurry because of the abrasive quality of the pad itself. The '794 patent also discloses the use of very dilute abrasive slurries containing less than 1% particulate abrasive particles. The '794 patent also discloses using abrasive slurries that contain extremely fine abrasive particles, preferably less than 0.1 µm, particularly ceria particles having a particle size of 0.02 µm to 2 µm, having an average particle size less than 1,000 Å, preferably less than 500 Å, more preferably less than 250 Å.

A need remains, however, for compositions and methods that will exhibit desirable planarization efficiency, uniformity, and removal rate during the polishing and planarization of substrates, particularly glass and/or semiconductor wafer surfaces, while minimizing defects, such as surface imperfections.

Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

BRIEF SUMMARY

We have discovered that a CMP slurry containing clay and relatively small $CeO_2$ particles can significantly improve the glass polishing rate without adversely affecting the finished surfaces. The abrasive slurry containing a combination of clay and $CeO_2$ preferably has a total concentration of abrasive particles (clay and $CeO_2$) greater than 1% by weight, preferably at least about 1.5% based on the total weight of the polishing slurry. In addition, the particle sizes of the clay and $CeO_2$ abrasive particles, in combination, unexpectedly increase the polishing rate, apparently by changing the particle size distribution of the combined abrasive particles in the polishing slurry.

Disclosed are compositions and methods for planarizing or polishing a surface, particularly glass surfaces, and semiconductor wafer surfaces. The polishing compositions described herein comprise (a) a liquid carrier; (b) clay abrasive particles; (c) $CeO_2$ abrasive particles; and optional additives, such as (d) a chemical accelerator; and (e) a complexing or coupling agent capable of chemically or ionically complexing with, or coupling to, the material removed during the polishing process. The complexing or coupling agent carries away the removed glass, metal and/or silicon dioxide insulator particles, during polishing, to prevent the separated particles from returning to the surface from which they were removed. Also disclosed are methods of planarizing or polishing a surface comprising contacting the surface with the abrasive particle-containing compositions.

Accordingly, one aspect of the compositions and methods described herein is to provide a method for planarizing or polishing glass surfaces using a synergistic combination of clay and $CeO_2$ particles as abrasive particles.

Another aspect of the compositions and methods described herein is to provide clay and $CeO_2$ abrasive particles, in a water/clay/$CeO_2$ particle slurry having clay and $CeO_2$ abrasive particles dispersed throughout the water. The particle size of the $CeO_2$ abrasive particles should be in the range of larger than about 0.1 µm to about 10 µm, preferably at least about 0.2 µm to about 5 µm. More preferably, the particle size of the $CeO_2$ abrasive particles are such that at least 90% of the particles (by number) have a mean particle size in the range of larger than about 0.1 µm to about 5 µm, most preferably at least about 0.2 µm to about 4 µm, to provide a slurry capable of planarizing glass, and/or insulator surfaces.

The particle size of the clay abrasive particles should be in the range of about 10 nm to about 10 µm, preferably about 50 nm to about 5 µm. More preferably, the particle size of the clay abrasive particles are such that at least 90% of the particles (by number) have a mean particle size in the range of about 0.1 µm to about 5 µm, most preferably larger than about 0.1 µm to about 4 µm, to provide a slurry capable of planarizing glass, and/or insulator surfaces.

The concentration of the clay particles in the slurry should be in the range of about 0.1% by weight to about 10% by weight, preferably about 0.2% to about 8%, most preferably about 0.4% to about 4%, based on the total weight of the slurry. The concentration of the $CeO_2$ particles in the slurry should be in the range of about 0.1% by weight to about 50%, preferably about 0.5% to about 20%, most preferably about 1% to about 10% by weight, based on the total weight of the slurry. The best polishing rates are achieved when the total concentration of clay and $CeO_2$ particles in the polishing slurry is above 1% by weight preferably at least about 1.1% by weight, more preferably at least about 1.5% by weight.

Another aspect of the compositions and methods described herein is to provide a planarizing composition that comprises an aqueous slurry of clay and $CeO_2$ abrasive particles in a combined amount of about 0.2 to about 60 wt. % of the slurry, preferably about 1% to about 30% by weight, more preferably about 2% to about 10% by weight.

The above and other aspects and advantages of the compositions and methods described herein will become more apparent from the following description of the preferred embodiments, taken in conjunction with the drawing.

DESCRIPTION OF THE PREFERRED EMBODIMENTS

Figure 1:
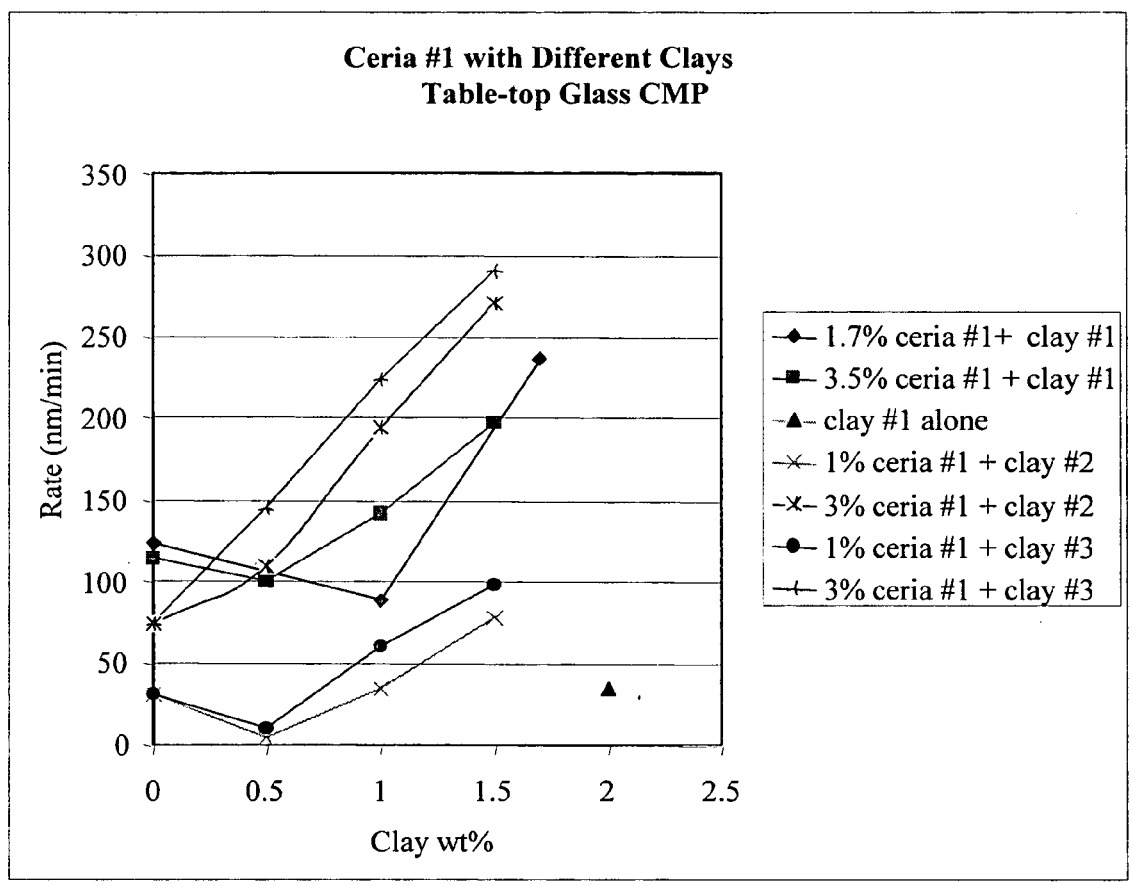
FIG. 1 is a graph showing the synergistic polishing rate results obtained from a combination of clay particles and negatively charged $CeO_2$ particles having a mean particle size of 250 nm in an aqueous slurry when combined in various amounts.

The polishing compositions comprise (a) a liquid carrier; (b) clay; and (c) $CeO_2$; and may include optional additives, such as (d) a chemical accelerator; and (e) a complexing or coupling agent capable of chemically or ionically complexing with, or coupling to, the removed glass, metal or insulating material being planarized. The compositions are useful in planarizing or polishing a surface, particularly glass. The compositions provide for high polishing efficiency, uniformity, and removal rate of a surface, including glass metal and insulative surfaces of a semiconductor wafer, with minimal defects, such as field loss of underlying structures and topography.

The total solids can be present in any suitable concentration in the compositions described herein. The solids desirably are present in a concentration above 1 wt. % or more (e.g., about 1.1–60 wt. %). Preferably, the total solids concentration is about 1.5% to about 30 wt. % of the composition.

The abrasive particles of the compositions described herein comprise a clay, preferably one or more ion-exchangeable smectite clays, that may be dioctahedral and/or trioctahedral smectite clays. The clay may be ion-exchanged with exchange cations selected from ammonium cations, or any alkali metal cations or alkaline earth metal cations, including lithium or sodium when polishing glass surfaces, but not including lithium or sodium when polishing dielectric surfaces. The preferred cations for ion-exchange with exchangeable cations contained in the clay are $Na^+$, $Ca^{++}$, $NH_4^+$, $K^+$, and $Ba^{++}$, or a mixture of two or more of said cations. Suitable dioctahedral and trioctahedral smectite clays that can be ion-exchanged with the above-mentioned cations include the following:

Dioctahedral: Beidellite; montmorillonite (bentonite); and Nontronite.

Trioctahedral: Saponite; and Hectorite.

Other clays that are useful as abrasive particles include both natural and synthetic clays, such as the following: Kaolinite clays, such as Halloysite and Kaolin clays; Serpentine clays, such as Lizardite clays, Amesite clays and Chrysotile clays; Pyrophyllite clay ($Al_2Si_4O_{10}(OH)_2$); Talc; Micas, such as Illite and Vermiculite; and any synthetic clays, including synthetic smectites, Laponite, and any other synthetic clay in any of the above clay groups and subgroups.

Optionally, an oxidizing component can be incorporated into the polishing composition, when polishing metal surfaces, to promote oxidation of a metal layer to its corresponding oxide. For example, an oxidizing component can be used to oxidize tungsten to tungsten oxide; thereafter, the tungsten oxide can be chemically and/or mechanically polished and removed. As a further example, the oxidizing component can oxidize copper to cuprous oxide or cupric oxide for more efficient removal and better planarization. Preferred oxidizing components include oxidizing salts, oxidizing metal complexes, iron salts, such as nitrates, sulfates, potassium ferri-cyanide and the like, aluminum salts, quaternary ammonium salts, phosphonium salts, peroxides, chlorates, perchlorates, permanganates, persulfates and mixtures thereof. Other suitable oxidizers can include, for example, oxidized halides (e.g., chlorates, bromates, iodates, perchlorates, perbromates, periodates, mixtures thereof, and the like). Suitable oxidizers also can include, for example, perboric acid, perborates, percarbonates, nitrates, persulfates, peroxides, e.g., hydrogen peroxide, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricynaide), mixtures thereof, and the like. The amount should be sufficient to ensure rapid oxidation of the metal layer while balancing the mechanical and chemical polishing performance of the system.

Other possible additives include filters, fibers, lubricants, wetting agents, pigments, dyes, coupling agents, plasticizers, surfactants, dispersing agents, suspending agents, chelating or complexing agents, catalysts, and the like. The polishing pad matrix material can comprise up to 80 weight percent filler and other optional ingredients. Examples of optional additives include EDTA, citrates, polycarboxylic acids and the like.

Any suitable chemical accelerator can be present in the composition. The chemical accelerator is an inorganic or organic compound which is soluble in water. The optional chemical accelerator acts to improve the planarization or polishing of a substrate, for example, as evidenced by an increased rate of substrate removal.

Suitable chelating or complexing agents can include, for example, glycine, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., disodium EDTA), mixtures thereof, and the like), carboxylates containing one or more sulfonic and/or phosphonic groups, and the like. Suitable chelating or complexing agents also can include, for example, di-, tri-, or poly-alcohols (e.g., ethylene glycol, procatechol, pyrogallol, tannic acid, and the like) and amine-containing compounds (e.g., amino acids, amino alcohols, di-, tri-, or poly-alcohols (e.g., ethylene glycol, pyrocatechol, pyrogallol, tannic acid, and the like) and amine-containing compounds (e.g., amino acids, amino alcohols, di-, tri-, and poly-amines, and the like). Suitable polishing accelerators also can include, for example, sulfates, halides (i.e., fluorides, chlorides, bromides, and iodides), and the like.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof; phthalates include phthalic acid, as well as mono-salts (e.g., potassium hydrogen phthalate) and di-salts thereof; perchlorates include the corresponding acid (e.g., perchloric acid), as well as salts thereof. Furthermore, certain compounds may perform more than one function. For example, some compounds can function both as a chelating and an oxidizing agent (e.g., certain ferric nitrates and the like).

If a chemical accelerator is included in the polishing composition, any suitable amount can be used. The chemical accelerator desirably is present in the polishing composition in an amount of about 0.01–20 wt. %; preferably about 0.7 wt. % to about 10 wt. %). Preferably, a chemical accelerator is present in the composition in an amount of about 0.75 wt. % to about 5 wt. %. More preferably, a chemical accelerator is present in the composition in an amount of about 0.5 to 4 wt. %, particularly 0.8 to 2.0 wt. %.

The composition can further include one or more other components, such as surfactants, polymeric stabilizers or other surface active dispersing agents, pH adjusters, regulators, or buffers, and the like. Suitable surfactants can include, for example, cationic surfactants, anionic surfactants, nonionic surfactants, amphoteric surfactants, fluorinated surfactants, mixtures thereof, and the like. Suitable polymeric stabilizers or other surface active dispersing agents can include, for example phosphoric acid, organic acids, tin oxides, organic phosphonates, mixtures thereof, and the like. Suitable pH adjusters, regulators, or buffers can include, for example, sodium hydroxide, sodium carbonate, sulfuric acid, hydrochloric acid, nitric acid, phosphoric acid, citric acid, potassium phosphate, mixtures thereof, and the like.

Any suitable carrier (e.g., solvent) can be used in the composition of the present invention. A carrier is used to facilitate the application of the abrasive purified clay particles onto the surface of a suitable substrate. A preferred carrier is water.

The pH of the composition is maintained in a range suitable for its intended end-use. The composition desirably has a pH of about 8 to about 12, preferably about 9 to about 11 for polishing glass surfaces. The pH may be about 2 to about 12 for polishing metal and/or dielectric surfaces.

The method of planarizing or polishing a surface comprises contacting a surface with a composition as described herein, preferably a glass surface. A surface can be treated with the composition by any suitable technique. For example, the composition can be applied to the surface through use of a polishing pad. The rate of removal of silicon dioxide, and/or metal is dependent on the rotational speed of the pad the downward force applied to the pad, and the flow rate of the abrasive composition, as well known in the art.

The compositions are capable of planarizing or polishing a glass substrate at a relatively high rate. Furthermore, the compositions of the present invention are well-suited for the planarizing or polishing of many hardened workpieces, such as memory or rigid disks, metals (e.g., noble metals), ILD layers, semiconductors, micro-electro-mechanical devices, ferroelectrics, magnetic heads, polymeric films, and low and high dielectric constant films. The compositions also can be used in the manufacture of integrated circuits and semiconductors. The compositions described herein exhibit desirable planarization efficiency, uniformity, removal rate, and low defectivity during the polishing and planarization of substrates, with synergistic polishing rates achieved at various percentages of clay in relation to the percentage of $CeO_2$.

In accordance with an important feature of the compositions and methods described herein, the combination of clay and $CeO_2$ abrasive particles comprise at least 50% by weight, more preferably at least about 70% by weight, and up to 100% by weight, based on the total weight of abrasive particles in the slurry composition. Clays that are useful as abrasive particles include both natural and synthetic clays, such as the following: smectite clay, Kaolinite clays, such as Halloysite and Kaolin clays; Serpentine clays, such as Lizardite clays, Amesite clays and Chrysotile clays; Pyrophyllite clay ($Al_2Si_4O_{10}(OH)_2$); Talc; Micas, such as Illite and Vermiculite; and any synthetic clays, including synthetic smectites, Laponite, and any other synthetic clay in any of the above clay groups and subgroups.

The preferred clay starting material: is a sodium smectite clay, such as sodium montmorillonite and/or sodium bentonite, having sodium as its predominant exchangeable interlayer cation. Sodium smectite clays are preferred since they can be easily exfoliated into individual platelets, when dispersed in aqueous solutions. The dispersed clay particles used in the CMP slurries have particle sizes such that at least 90% of the abrasive particles (by number) have a particle size of about 10 nm to about 10 μm, more preferably about 50 nm to 5 μm, most preferably about 100 nm to about 4 μm and suspended in water, as a dilute aqueous suspension, e.g., less than about 5% by weight clay, preferably about 1% to about 4% by weight clay, based on the total weight of clay and water. This dilute clay suspension is accomplished by first grinding the clay material to a powder form. Then the powder is dispersed in water under high shear conditions, e.g., using a waring blender at 15,000 rpm for 10 to 20 minutes and the sheared suspension is allowed to settle, e.g., for 24 hours, to settle the grit, quartz, and other non-clay impurities. The sediment is discarded and the supernatant dilute suspension is collected and may be concentrated or dried to a desired water content, for use in the polishing composition.

EXAMPLES

The following examples further illustrate the present invention but, of course, should not be construed as in any way to limit its scope.

Three different kinds of ceria particles made by different manufacturers were used. These ceria particles have different sizes and surface charges. Also, three different size abrasive clay particles were used. The polishing rates and slurry compositions are listed in Tables I–V. The mean size and surface charges of ceria and sodium montmorillonite clay particles were measured at a pH of about 7, and were as follows:

TABLE 1

Abrasive Particles

| Material | Source | Zeta Potential (mV) @ 0.1% solids | Mean particle size (nm) |
|---|---|---|---|
| Ceria #1 | Nyacol DP7090 | −48 | 250 |
| Ceria #2 | Nanophase SG18R | −70 | 650 |
| Ceria #3 | Nanophase GP12D | +50 | 165 |

| Material | Source | Zeta Potential (mV) @ 0.1% solids | Mean particle size (μm) |
|---|---|---|---|
| Clay #1 | Centrifuged PGN (3200 rpm, 30 min) | −38 | 0.41 |
| Clay #2 | Centrifuged Supercol (3200 rpm, 30 min) | −43 | 0.61 |
| Clay #3 | PGN | −43 | 1.12 |

Example 1

The polishing experiments were carried out using a bench-top Struers DAP-V polisher. The pure quartz disks (CHEMGLASS, INC., CGQ-0600-03) have a diameter of 1 inch and a thickness of 0.25 inch. The polishing pads were IC-1400 (CR IC 1400-A3, 8 inches in diameter, K-GRV grooved, PSA) provided by Rodel, Inc. The pads were hand-conditioned with 220-grit sandpaper and a nylon brush before being used. The center-to-center distance between the disk and the pad was 5.5 cm. The polishing table and the disk holder are both rotated at a speed of 100 rpm in the same clockwise direction. The applied downward pressure is 5 psi and the slurry flow rate is 30 ml/min. The polishing rates were determined from the mass loss of glass from the disks during 3 minute, 6 minute, 9 minute and 12 minute polishing runs and the reported values are the average of these four runs.

Figure 2:
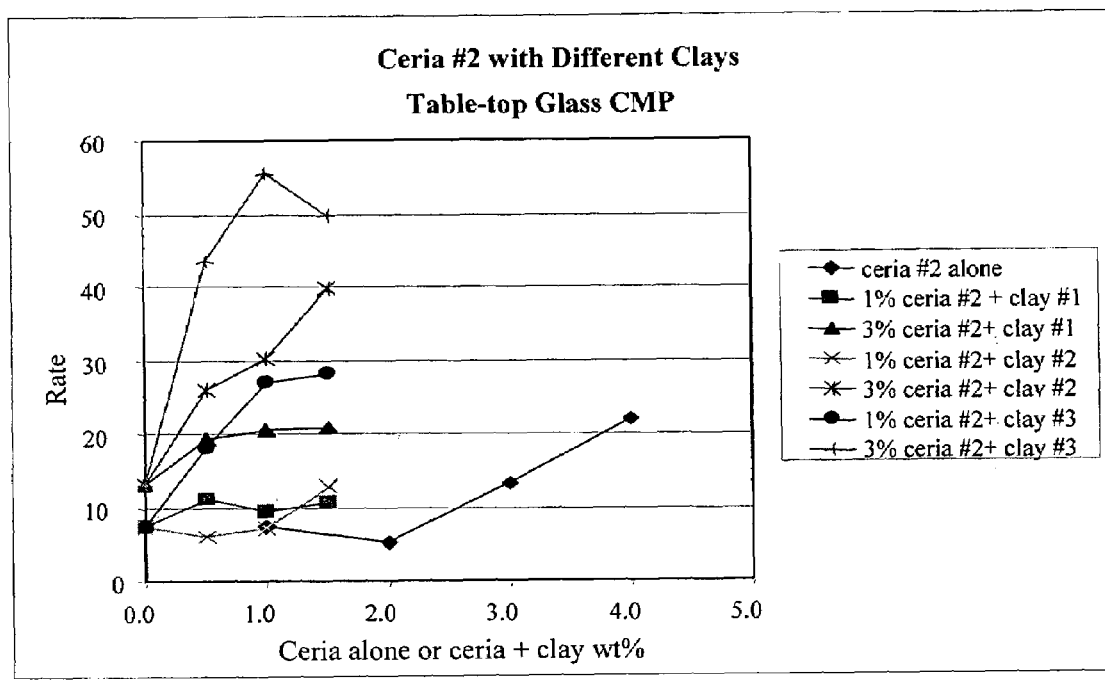
FIG. 2 is a graph showing the synergistic polishing rate results obtained from a combination of clay particles and positively charged $CeO_2$ particles having a mean particle size of 165 nm in an aqueous slurry when combined in various amounts.
Figure 3:
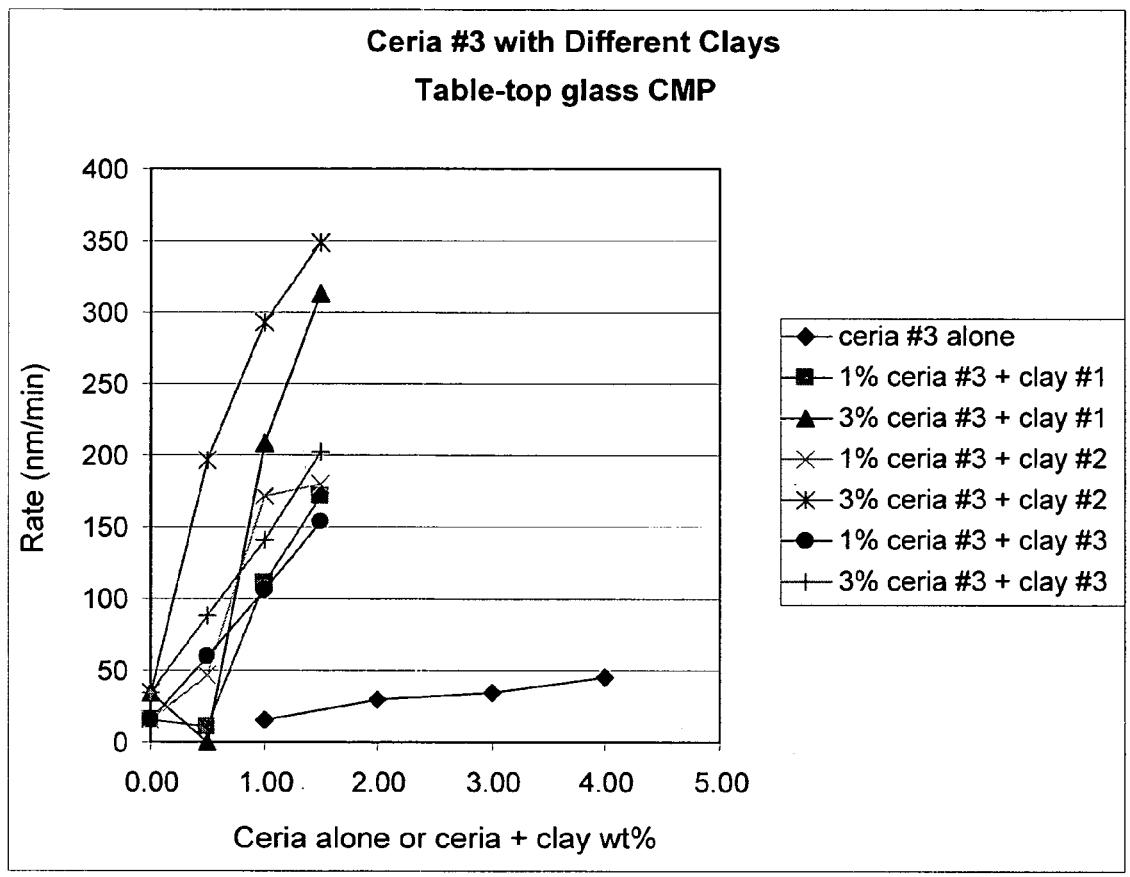
FIG. 3 is a graph showing the synergistic polishing rate results obtained from a combination of clay particles and negatively charged $CeO_2$ particles having a mean particle size of 650 nm in an aqueous slurry when combined in various amounts.

The following Tables 2–4 and FIGS. 1–3 show the rate of glass removal using the slurry polishing compositions containing the indicated percentages of each of the three sodium montmorillonite clay particles and each of the three ceria particles of Table 1.

TABLE 2

Glass CMP results using ceria #1 with different clays at pH = 10.*

| Ceria #1 (wt %) | Clay #1 (wt %) | Clay #2 (wt %) | Clay #3 (wt %) | Rate (nm/min) |
|---|---|---|---|---|
| 1 | | | | 31 |
| 1.7 | | | | 123 |
| 3 | | | | 74 |
| 3.5 | | | | 114 |
| 1.7 | 0 | | | 123 |
| 1.7 | 1 | | | 88 |
| 1.7 | 1.7 | | | 236 |
| 3.5 | 0 | | | 114 |
| 3.5 | 0.5 | | | 100 |
| 3.5 | 1 | | | 141 |
| 3.5 | 1.5 | | | 197 |
| 1.0 | | 0 | | 31 |
| 1.0 | | 0.5 | | 4 |
| 1.0 | | 1 | | 34 |
| 1.0 | | 1.5 | | 77 |
| 3.0 | | 0 | | 74 |
| 3.0 | | 0.5 | | 109 |
| 3.0 | | 1 | | 194 |
| 3.0 | | 1.5 | | 270 |
| 1.0 | | | 0 | 31 |
| 1.0 | | | 0.5 | 10 |
| 1.0 | | | 1 | 60 |
| 1.0 | | | 1.5 | 97 |
| 3.0 | | | 0 | 74 |
| 3.0 | | | 0.5 | 145 |
| 3.0 | | | 1 | 224 |
| 3.0 | | | 1.5 | 290 |

*$CeO_2$ particles are negatively charged at pH = 10

As shown in Table 2 and FIG. 1, the $CeO_2$ #1 particles alone provide a better polishing rate than the combination of $CeO_2$ and clay until a synergistic combination is reached. The amount of clay necessary in combination with the $CeO_2$ varies substantially depending on the percentage of $CeO_2$ in the polishing composition. However, at each percentage of $CeO_2$, the amount of clay needed to increase the polishing rate can be determined easily, experimentally, by increasing the amount of clay until the polishing rate increases to a value above the polishing rate achieved with the percentage of $CeO_2$ alone.

Example 2

The same procedure was carried out as in Example 1, using the same three sodium montmorillonite clay abrasive particles, but using $CeO_2$ #2 abrasive particles that were negatively charged, having a mean particle size of 650 nm. The percentages of clay and negatively charged $CeO_2$ abrasive particles were varied, as shown in Table 3, and FIG. 2.

TABLE 3

Glass CMP results using ceria #2 with different clays at pH = 10.*

| Ceria #2 (wt %) | Clay #1 (wt %) | Clay #2 (wt %) | Clay #3 (wt %) | Rate (nm/min) |
|---|---|---|---|---|
| 1.0 | | | | 74 |
| 2.0 | | | | 51 |
| 3.0 | | | | 131 |
| 4.0 | | | | 219 |
| 1.0 | 0 | | | 74 |
| 1.0 | 0.5 | | | 111 |
| 1.0 | 1 | | | 94 |
| 1.0 | 1.5 | | | 106 |
| 3.0 | 0 | | | 131 |
| 3.0 | 0.5 | | | 194 |
| 3.0 | 1 | | | 205 |
| 3.0 | 1.5 | | | 208 |
| 1.0 | | 0 | | 74 |
| 1.0 | | 0.5 | | 60 |
| 1.0 | | 1 | | 71 |
| 1.0 | | 1.5 | | 128 |
| 3.0 | | 0 | | 131 |
| 3.0 | | 0.5 | | 259 |
| 3.0 | | 1 | | 302 |
| 3.0 | | 1.5 | | 398 |
| 1.0 | | | 0 | 74 |
| 1.0 | | | 0.5 | 182 |
| 1.0 | | | 1 | 270 |
| 1.0 | | | 1.5 | 282 |
| 3.0 | | | 0 | 131 |
| 3.0 | | | 0.5 | 436 |
| 3.0 | | | 1 | 555 |
| 3.0 | | | 1.5 | 498 |

*$CeO_2$ particles are negatively charged at pH = 10

As shown in Table 3 and FIG. 2, the $CeO_2$ #2 particles alone provide a better polishing rate than the combination of $CeO_2$ and clay until a synergistic combination is reached. The amount of clay necessary in combination with the $CeO_2$ varies substantially depending on the percentage of $CeO_2$ in the polishing composition. However, at each percentage of $CeO_2$, the amount of clay needed to increase the polishing rate can be determined easily, experimentally, by increasing the amount of clay until the polishing rate increases to a value above the polishing rate achieved with the percentage of $CeO_2$ alone.

Example 3

The same procedure was carried out as in Example 1, using the same three sodium montmorillonite clay abrasive particles, but using $CeO_2$ #3 abrasive particles that were positively charged, having a mean particle size of 165 nm. The percentages of clay and positively charged $CeO_2$ abrasive particles were varied, as shown in Table 4, and FIG. 3.

TABLE 4

Glass CMP results using ceria #3 with different clays at pH = 10.*

| Ceria #3 (wt %) | Clay #1 (wt %) | Clay #2 (wt %) | Clay #3 (wt %) | Rate (nm/min) |
|---|---|---|---|---|
| 1.0 | | | | 15 |
| 2.0 | | | | 30 |
| 3.0 | | | | 34 |
| 4.0 | | | | 45 |
| 1.0 | 0 | | | 15 |
| 1.0 | 0.5 | | | 11 |
| 1.0 | 1 | | | 111 |
| 1.0 | 1.5 | | | 171 |
| 3.0 | 0 | | | 34 |
| 3.0 | 0.5 | | | 0 |
| 3.0 | 1 | | | 208 |
| 3.0 | 1.5 | | | 313 |
| 1.0 | | 0 | | 15 |
| 1.0 | | 0.5 | | 46 |
| 1.0 | | 1 | | 171 |
| 1.0 | | 1.5 | | 180 |
| 3.0 | | 0 | | 34 |
| 3.0 | | 0.5 | | 197 |
| 3.0 | | 1 | | 293 |
| 3.0 | | 1.5 | | 349 |
| 1.0 | | | 0 | 15 |
| 1.0 | | | 0.5 | 60 |
| 1.0 | | | 1 | 106 |
| 1.0 | | | 1.5 | 154 |
| 3.0 | | | 0 | 34 |
| 3.0 | | | 0.5 | 88 |
| 3.0 | | | 1 | 141 |
| 3.0 | | | 1.5 | 202 |

*$CeO_2$ particles are negatively charged at pH = 10

The results clearly indicate that all clay abrasive particles (#1, #2, and #3) have strong synergistic effects with all three different abrasive ceria particles in chemical mechanical polishing (CMP). When synergistic amounts of clay are added, the polishing rates are improved significantly. There seems to be a threshold clay concentration (TCC). Once the clay concentration is higher than the TCC, the synergistic effect takes place, and higher clay percentages increase the polishing rate. The TCC (or clay/ceria ratio) strongly depends on the system conditions, such as ceria type, and ceria wt %.

The polished surfaces look smooth when examined by naked eyes. Although the inspection so far is limited, the polished glass is not expected to have worse roughness in clay+ceria systems than the ceria alone system. This is due to the fact that the glass surface is much harder than the clay particles, and therefore, clay particles should not scratch the glass surface easily, at least not as easy as ceria particles.

As shown in Tables I–V, clay/ceria glass CMP slurries can significantly increase the polishing rate without sacrificing the surface roughness.

What is claimed is:

1. A method of planarizing or polishing a surface comprising polishing the surface with a composition comprising (a) a liquid carrier, and (b) solids comprising about 0.1 to about 10% by weight clay abrasive particles, and about 0.1% to about 50% by weight $CeO_2$, particles, based on the total weight of the composition, said clay abrasive particles having a particle size such that at least 90% of the particles, by number, when dispersed in water, have a particle size in the range of about 10nm to about 10μm, and the $CeO_2$ abrasive particles having a particle size such that at least 90% of the particles, by number, when dispersed in water, have a particle size in the range of larger than 0.1μm to about 10μm.

2. The method of claim 1 wherein the percentage of clay abrasive particles contained in the polishing composition in comparison to the percentage of $CeO_2$ abrasive particles contained in the polishing composition is an amount such that a glass polishing rate achieved is better than the rate of glass polishing achieved with the $CeO_2$ alone.

3. The method of claim 1, wherein the surface is glass.

4. The method of claim 1, wherein the surface is an integrated circuit, a memory disk, or a rigid disk surface.

5. The method of claim 4, wherein the composition further includes a chemical accelerator selected from a peroxide, a sulfate, a persulfate or a nitrate.

6. The method of claim 5, wherein the chemical accelerator is selected from the group consisting of hydrogen peroxide, ammonium persulfate, iron (III) nitrate, and hydroxylamine nitrate.

7. The method of claim 1 wherein the clay abrasive particles comprise a smectite clay.

8. The method of claim 1, wherein the solids are present in the composition in an amount of about 0.1 to about 60 wt. % of the composition.

9. The method of claim 1, wherein the carrier is water.

10. The method of claim 1, wherein the clay is selected from the group consisting of a smectite clay; a kaolinite clay; a serpentine clay; a Pyrophyllite clay; talc, mica, and a synthetic clay.

11. The method of claim 10, wherein the clay is selected from the group consisting of Beidellite; Nontsonite; Volkonskoite; Saponite; Hectorite; Halloysite; Kaolin; Serpentine clays, such as Lizardite; Amesite; Chrysotile; Pyrophyllite; Talc; Illite; Vermiculite; a synthetic smectite; Japonite; and a combination thereof.

12. The method of claim 11, wherein the clay is a smectite clay selected from the group consisting of bentonite, montmorillonite, and combinations thereof.

13. The method of claim 1, wherein the clay abrasive particles have a particle size such that at least 90% of the particles are in the range of 50nm to 5µm.

14. The method of claim 13, wherein the $CeO_2$ abrasive particles each have a particle size such that at least 90% of the particles are in the range of larger than 0.1µm to 4µm.

* * * * *